(12) United States Patent
Lin et al.

(10) Patent No.: US 11,552,222 B2
(45) Date of Patent: Jan. 10, 2023

(54) DISPLAY DEVICE

(71) Applicant: Lextar Electronics Corporation, Hsinchu (TW)

(72) Inventors: Chih-Hao Lin, Hsinchu (TW); Hui-Ru Wu, Hsinchu (TW); Jo-Hsiang Chen, Hsinchu (TW); Jian-Chin Liang, Hsinchu (TW); Ai-Sen Liu, Hsinchu (TW)

(73) Assignee: Lextar Electronics Corporation, Hsinchu (TW)

(*) Notice: Subject to any disclaimer, the term of this patent is extended or adjusted under 35 U.S.C. 154(b) by 247 days.

(21) Appl. No.: 16/879,787

(22) Filed: May 21, 2020

(65) Prior Publication Data

US 2021/0367113 A1   Nov. 25, 2021

(51) Int. Cl.
*H01L 33/50* (2010.01)
*H01L 33/60* (2010.01)
*H01L 25/075* (2006.01)

(52) U.S. Cl.
CPC ........ *H01L 33/504* (2013.01); *H01L 25/0753* (2013.01); *H01L 33/60* (2013.01)

(58) Field of Classification Search
CPC ........... H01L 33/502; H01L 2933/0041; H01L 27/322
See application file for complete search history.

(56) References Cited

U.S. PATENT DOCUMENTS

| | | | |
|---|---|---|---|
| 7,819,717 B2 * | 10/2010 | Hosoda | ............... H01L 27/3213 313/506 |
| 9,111,464 B2 | 8/2015 | Bibl et al. | |
| 9,666,765 B2 | 5/2017 | Choi | |
| 9,991,423 B2 | 6/2018 | Bower et al. | |
| 10,008,483 B2 | 6/2018 | Cok et al. | |

(Continued)

FOREIGN PATENT DOCUMENTS

| CN | 209561408 U | 10/2019 |
|---|---|---|
| JP | 5508244 B2 | 5/2014 |
| TW | I576534 B | 4/2017 |

OTHER PUBLICATIONS

Linlin Li et al., "Synthesis and luminescent properties of high brightness MLa(WO4)2:EU3+(M=Li, Na, K) and NaRE(WO4)2:EU3+ (RE=Gd, Y, Lu) red phosphors", Journal of Luminescence, 2013.

(Continued)

*Primary Examiner* — Andrew J Coughlin
(74) *Attorney, Agent, or Firm* — CKC & Partners Co., LLC

(57) ABSTRACT

The display device includes a substrate, a patterned wall, the first, second, third sub-pixels, and an optical layer. The patterned wall is disposed on the substrate and has a plurality of openings. The first sub-pixel is disposed in one of the openings and includes a light-emitting element and a wavelength conversion layer. The second sub-pixel is disposed in one of the openings and includes a light-emitting element and a wavelength conversion layer. The third sub-pixel is disposed in one of the openings and includes a light-emitting element and a wavelength conversion layer, wherein a first distance between a top surface of the light-emitting element and a top surface of the patterned wall is about 10 um to about 100 um. The optical layer is disposed on the patterned wall and in direct contact with at least one of the first sub-pixel, the second sub-pixel, and the third sub-pixel.

22 Claims, 16 Drawing Sheets

(56) References Cited

U.S. PATENT DOCUMENTS

| | | | |
|---|---|---|---|
| 10,700,246 B2* | 6/2020 | Sim | H01L 27/153 |
| 11,094,530 B2* | 8/2021 | Zhang | H01L 25/0753 |
| 2004/0195963 A1* | 10/2004 | Choi | H01L 27/322 |
| | | | 313/506 |
| 2007/0200495 A1* | 8/2007 | Kai | H01L 27/3213 |
| | | | 313/506 |
| 2007/0201056 A1* | 8/2007 | Cok | B82Y 20/00 |
| | | | 358/1.9 |
| 2007/0222367 A1* | 9/2007 | Hosoda | H01L 27/3213 |
| | | | 313/503 |
| 2014/0264419 A1 | 9/2014 | Kim et al. | |
| 2015/0362165 A1* | 12/2015 | Chu | H01L 27/156 |
| | | | 362/235 |
| 2017/0294479 A1* | 10/2017 | Cha | H01L 33/0012 |
| 2019/0165318 A1* | 5/2019 | Choi | H01L 27/322 |

OTHER PUBLICATIONS

Priti B. Deshmukh et al., "Luminescent properties of MAl(SO4)2Br:Eu3+(M=Sr or Mg) red phosphors for near-UV light-emitting diodes", LUMINESCENCE The Journal of Biological and Chemical Luminescence, 2014.

* cited by examiner

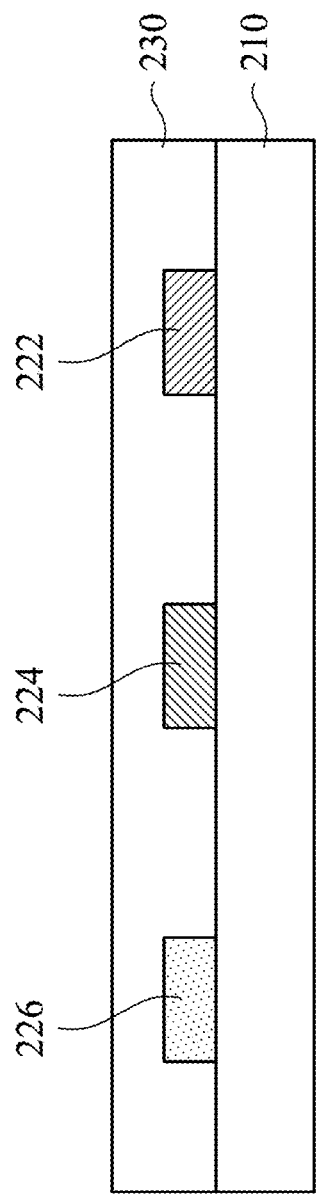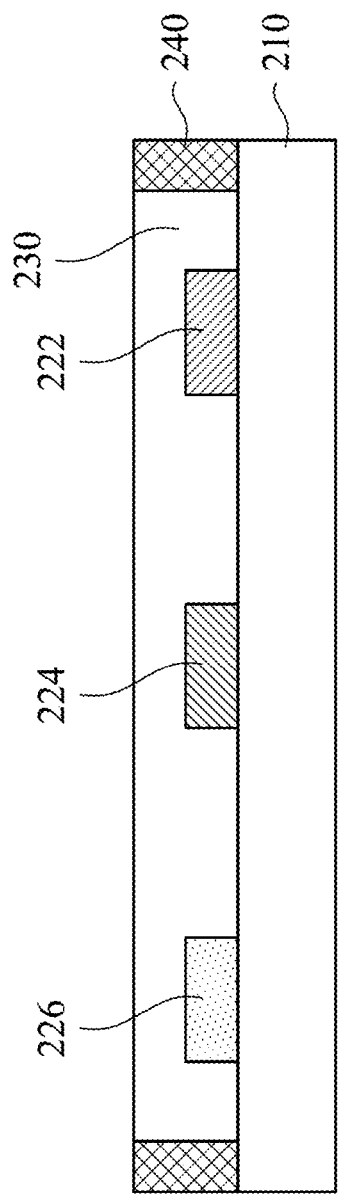

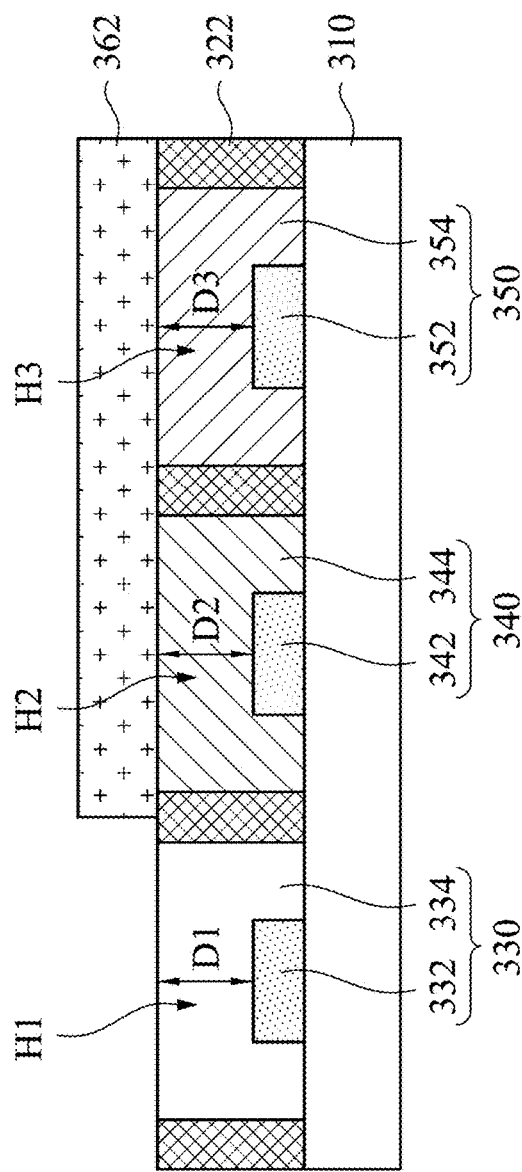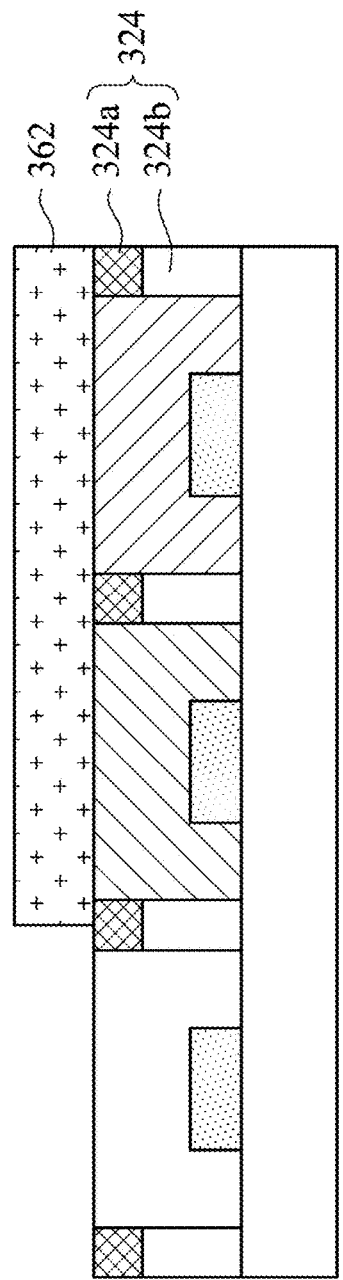
Fig. 3A
Fig. 3B

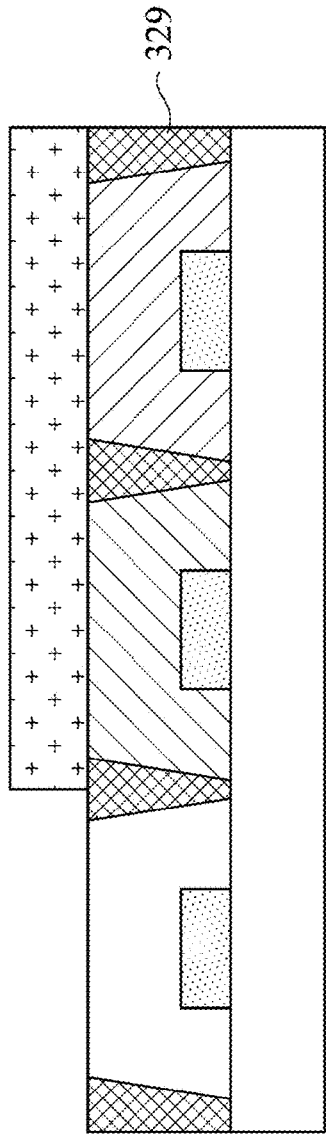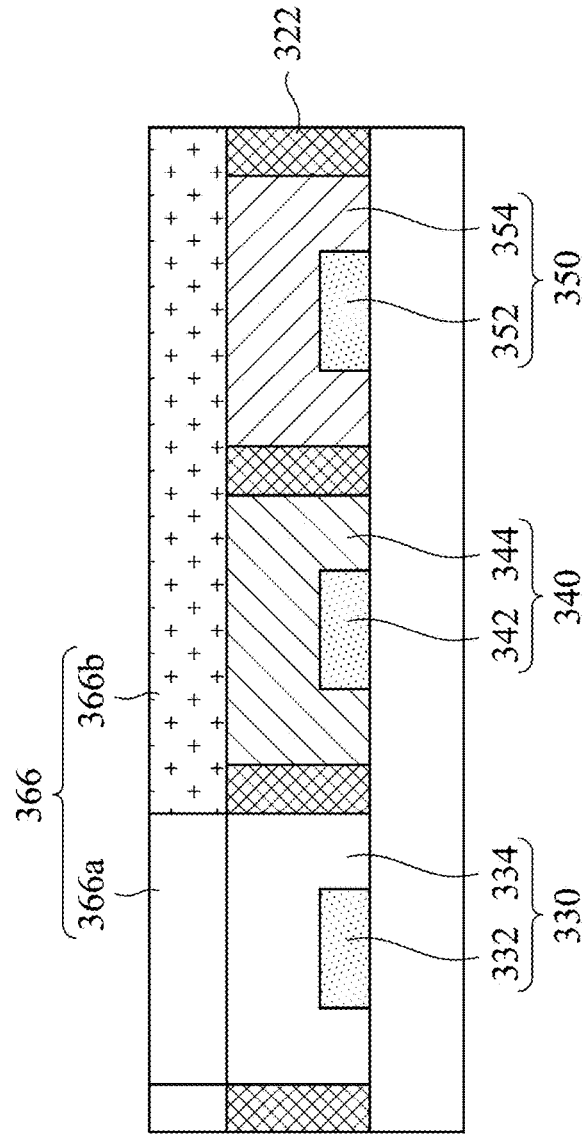

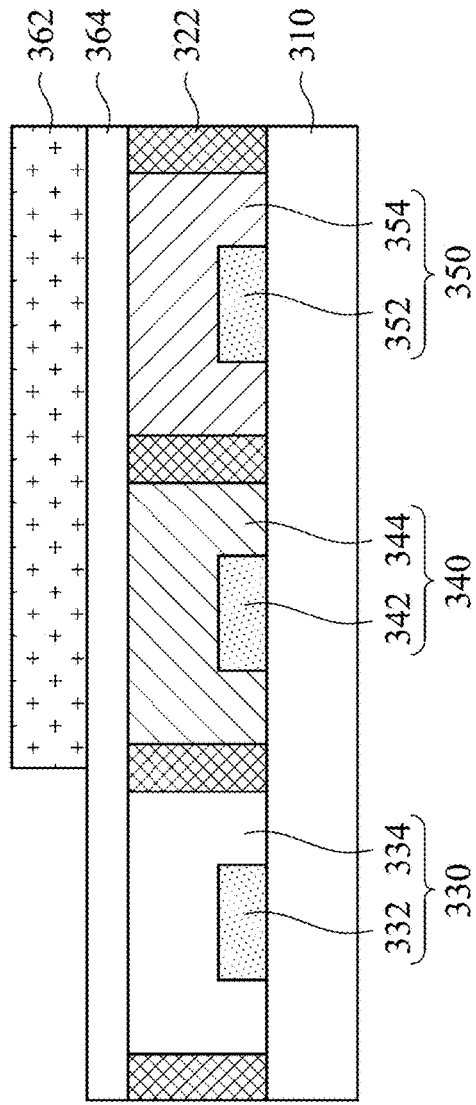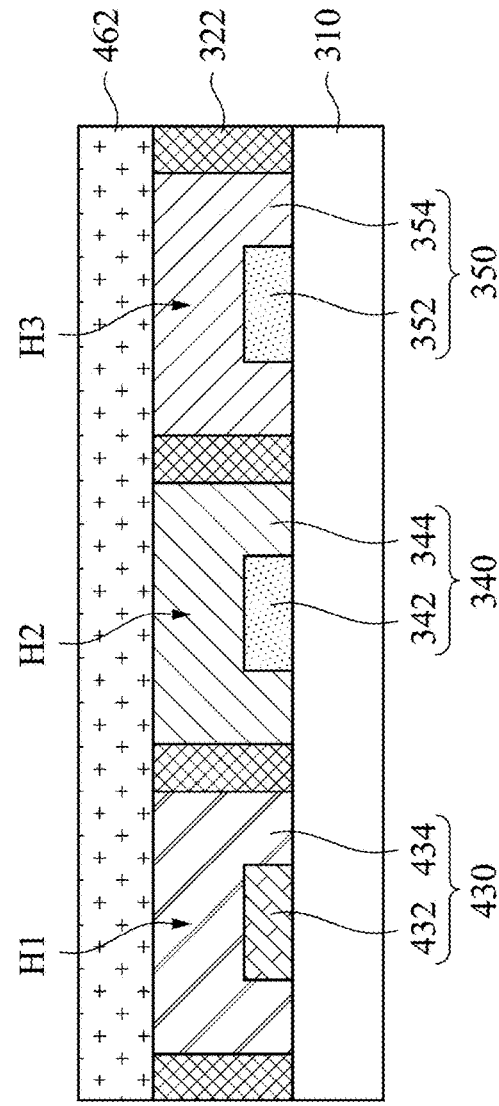

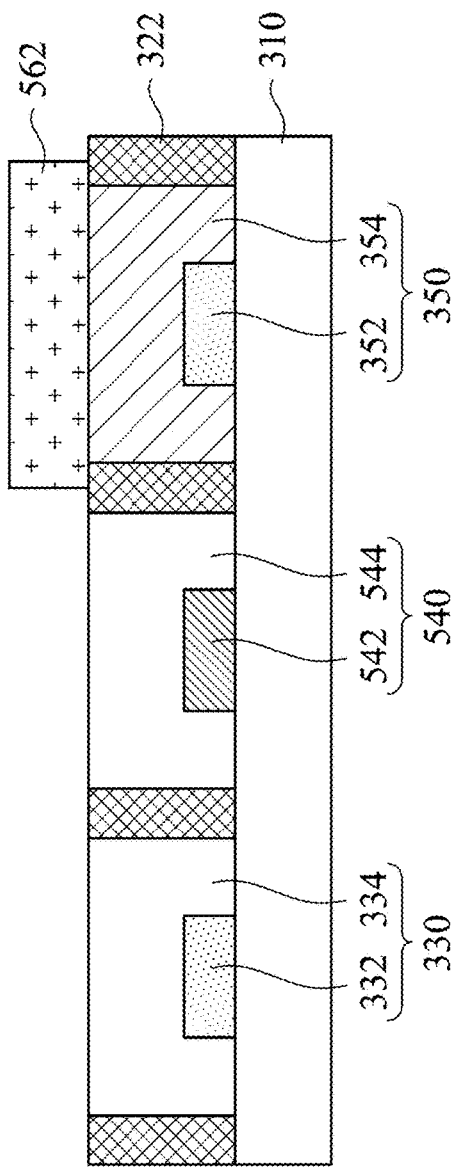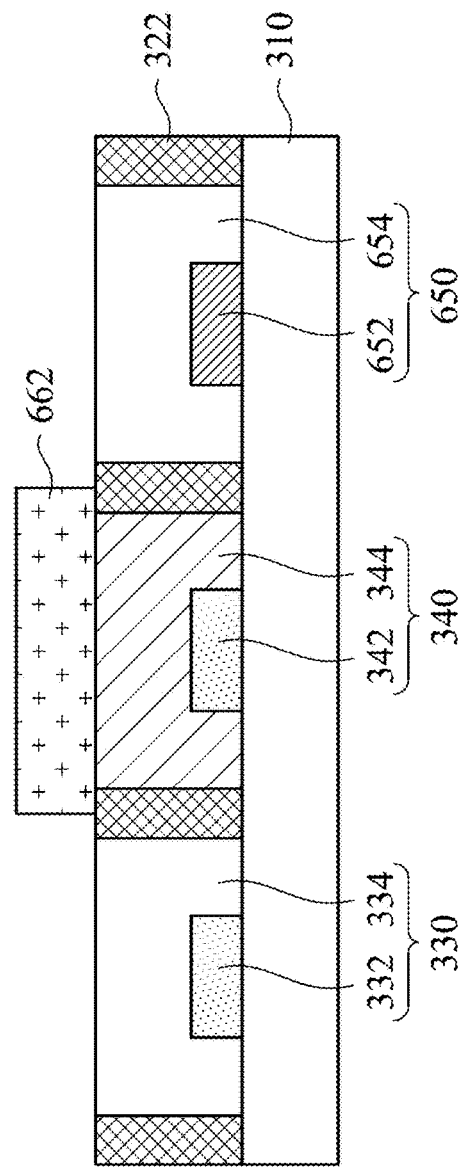

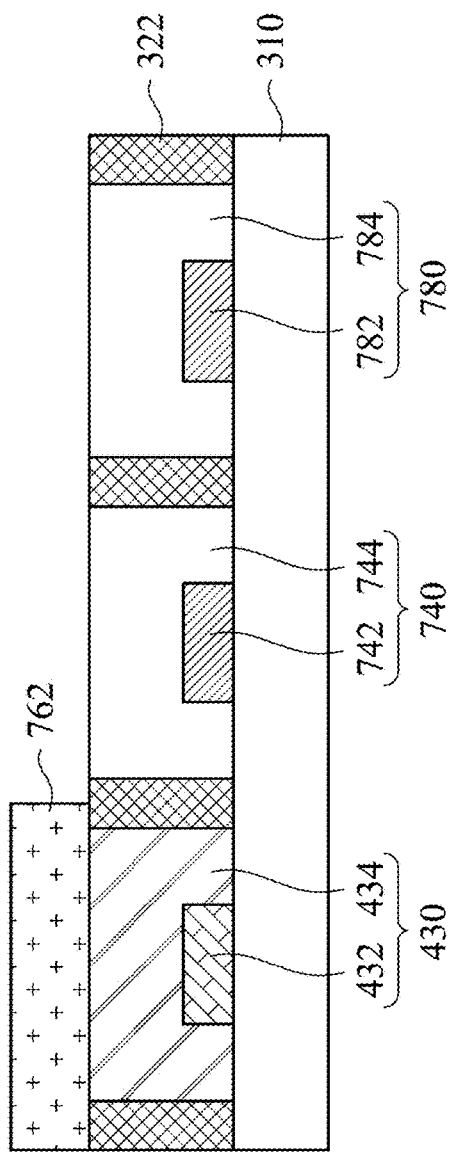
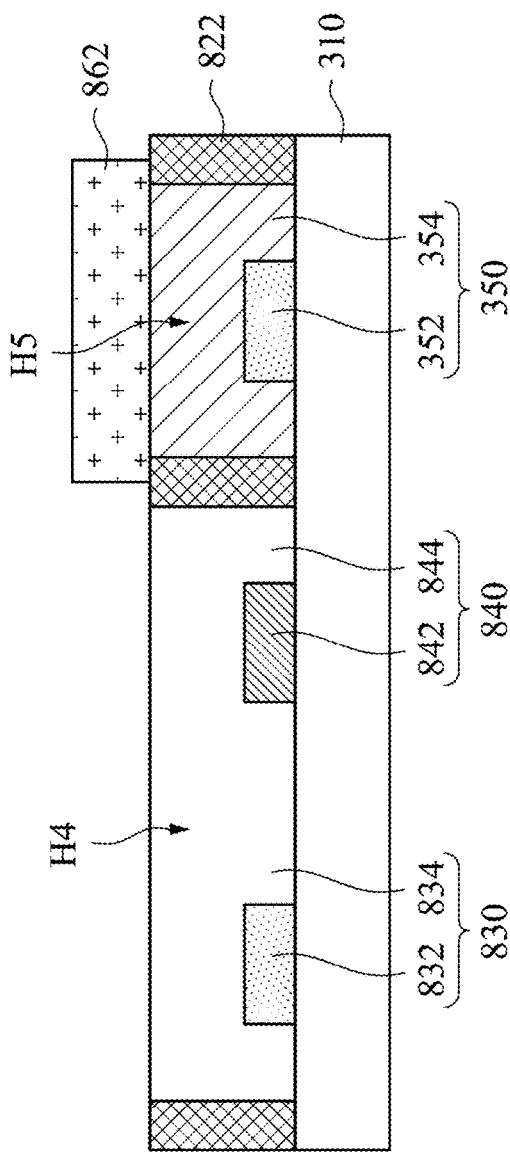
Fig. 7
Fig. 8

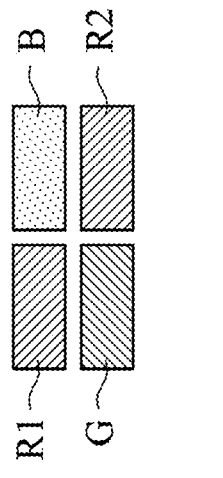
Fig. 12A
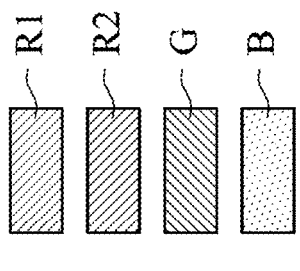
Fig. 12B
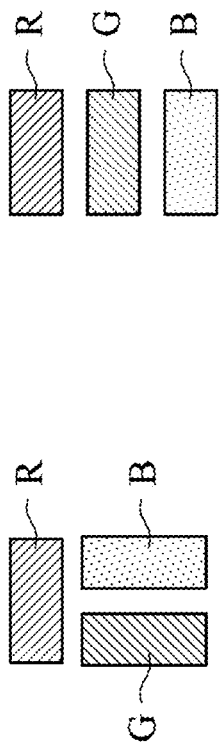
Fig. 12C
Fig. 12D
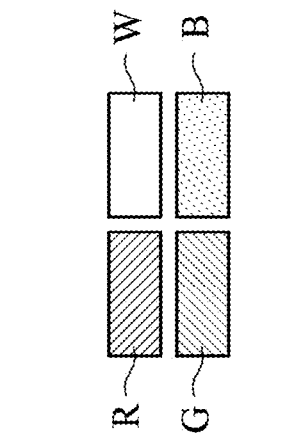
Fig. 12E
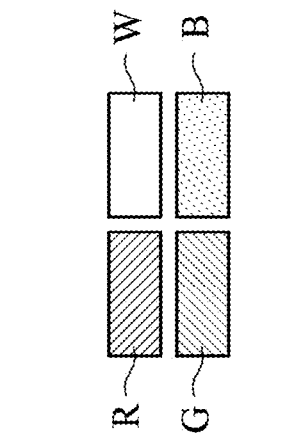
Fig. 12F
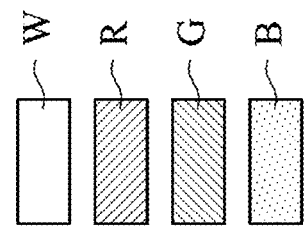
Fig. 12G
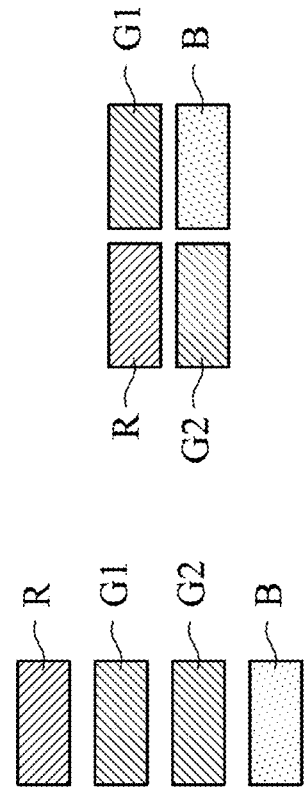
Fig. 12H

DISPLAY DEVICE

BACKGROUND

Field of Invention

The present invention relates to a display device. More particularly, the present invention relates to a display device having a wavelength conversion layer.

Description of Related Art

Display devices that use light-emitting diodes (LEDs) display mostly use three-primary-color chips to display the color of one color point on one pixel, and the light-emitting ratios of three-color chips are adjusted to meet the required colors. However, because the arrangement pitch in a single pixel may cause uneven mixing of some colors, thereby resulting in "mura effect", how to reduce the pitch between the chips in a pixel becomes one of the improvement directions. When the pitch between the chips of the pixel in the display device is reduced, the perception of color for human eyes becomes more sensitive (shown in FIG. 1), and the color uniformity requirements of the display device also become higher. Therefore, fewer chips can be used, resulting in increased production costs.

SUMMARY

Accordingly, it is a primary object of the invention to provide a novel display device which may improve the foregoing problems.

According to one aspect of the present disclosure, a display device is provided. The display device includes a substrate, a patterned wall, a first sub-pixel, a second sub-pixel, a third sub-pixel, and a first optical layer. The patterned wall is disposed on the substrate and has a plurality of openings. The first sub-pixel is disposed in one of the openings and includes a first light-emitting element and a first wavelength conversion layer, wherein the first light-emitting element is disposed on the substrate, and the first wavelength conversion layer covers the first light-emitting element. The second sub-pixel is disposed in one of the openings and includes a second light-emitting element and a second wavelength conversion layer, wherein the second light-emitting element is disposed on the substrate, and the second wavelength conversion layer covers the second light-emitting element. The third sub-pixel is disposed in one of the openings and includes a third light-emitting element and a third wavelength conversion layer, wherein the third light-emitting element is disposed on the substrate, the third wavelength conversion layer covers the third light-emitting element, and a first distance between a first top surface of the first light-emitting element and a second top surface of the patterned wall is about 10 um to about 100 um. The first optical layer is disposed on the patterned wall and in direct contact with at least one of the first sub-pixel, the second sub-pixel, and the third sub-pixel.

In some embodiments of the present disclosure, the first top surface of the first light-emitting element substantially levels with a third top surface of the second light-emitting element, and the first top surface of the first light-emitting element substantially levels with a fourth top surface of the third light-emitting element.

In some embodiments of the present disclosure, the first, second and third light-emitting elements respectively emit a light with a first wavelength.

In some embodiments of the present disclosure, the first wavelength conversion layer allows the light with the first wavelength to penetrate, the second wavelength conversion layer converts the light with the first wavelength into a light with a second wavelength, and the third wavelength conversion layer converts the light with the first wavelength into a light with a third wavelength.

In some embodiments of the present disclosure, the first optical layer covers the second sub-pixel and the third sub-pixel, and the first optical layer reflects or absorbs the lights with the first wavelength emitted from the second and third light-emitting elements.

In some embodiments of the present disclosure, the first optical layer fully covers the first sub-pixel, the second sub-pixel and the third sub-pixel, wherein the first optical layer comprises a first portion and a second portion, the first portion is disposed on the first sub-pixel, and the second portion is disposed on the second and third sub-pixels.

In some embodiments of the present disclosure, the display device further includes a second optical layer disposed between the patterned wall and the first optical layer.

In some embodiments of the present disclosure, the patterned wall comprises at least one of a light-absorbing material and a light-reflecting material.

In some embodiments of the present disclosure, the display device further includes a planarization layer disposed between the substrate and the patterned wall, wherein the first, second, and third light-emitting elements are embedded in the planarization layer.

In some embodiments of the present disclosure, the display device further includes a planarization layer disposed between the substrate and the patterned wall, wherein an upper surface of the planarization layer is higher than top surfaces of the first, second, and third light-emitting elements.

In some embodiments of the present disclosure, the display device further includes a planarization layer disposed between the substrate and the patterned wall, and an upper surface of the planarization layer substantially levels with top surfaces of the first, second, and third light-emitting elements.

In some embodiments of the present disclosure, the display device further includes a fourth sub-pixel disposed in one of the openings and comprising a fourth light-emitting element and a fourth wavelength conversion layer, wherein the fourth light-emitting element is disposed on the substrate, and the fourth wavelength conversion layer covers the fourth light-emitting element.

In some embodiments of the present disclosure, the first, second, third, and fourth light-emitting elements are red light-emitting elements, blue light-emitting elements, green light-emitting elements, white light-emitting elements, or a combination thereof.

According to another aspect of the present disclosure, a display device is provided. The display device includes a substrate, a patterned wall, a first light-emitting element, a second light-emitting element, a third light-emitting element, a wavelength conversion layer, and an optical layer. The patterned wall is disposed on the substrate and has an opening. The first light-emitting element, the second light-emitting element, and the third light-emitting element are disposed in the opening and on the substrate. The wavelength conversion layer is disposed in the opening and covering the first, second, and third light-emitting elements, wherein a first distance between a first top surface of the first light-emitting element and a second top surface of the patterned wall is about 10 um to about 100 um.

In some embodiments of the present disclosure, the first top surface of the first light-emitting element substantially levels with a third top surface of the second light-emitting element, and the first top surface of the first light-emitting element substantially levels with a fourth top surface of the third light-emitting element.

In some embodiments of the present disclosure, the first light-emitting element emit a light with a first wavelength, the second light-emitting element emit a light with a second wavelength, the third light-emitting element emit a light with a third wavelength, and the wavelength conversion layer converts the light with the third wavelength into a light with a fourth wavelength or converts the light with the second wavelength into a light with a fifth wavelength.

In some embodiments of the present disclosure, the display device further includes a planarization layer disposed between the substrate and the patterned wall, wherein the planarization layer covers the first, second, and third light-emitting elements.

In some embodiments of the present disclosure, the display device further includes a planarization layer disposed between the substrate and the patterned wall, wherein an upper surface of the planarization layer is higher than top surfaces of the first, second, and third light-emitting elements.

In some embodiments of the present disclosure, the display device further includes a planarization layer disposed between the substrate and the patterned wall, wherein an upper surface of the planarization layer substantially levels with top surfaces of the first, second, and third light-emitting elements.

In some embodiments of the present disclosure, the patterned wall comprises at least one of a light-absorbing material and a light-reflecting material.

In some embodiments of the present disclosure, wherein the optical layer comprises a monolayer or a multilayer.

In some embodiments of the present disclosure, the display device further includes an optical layer disposed on the patterned wall and in direct contact with the wavelength conversion layer.

BRIEF DESCRIPTION OF THE DRAWINGS

The invention can be more fully understood by reading the following detailed description of the embodiment, with reference made to the accompanying drawings as follows:

FIGS. 2A and 2B are cross-sectional views illustrating a display device according to one comparative example.

FIGS. 3A to 3G are cross-sectional views illustrating a display device according to various embodiments of the present disclosure.

FIGS. 4, 5, 6, 7, 8, 9, 10, and 11 illustrate a display device according to some embodiments of the present disclosure.

FIGS. 12A to 12H are top views illustrating the arrangement of light-emitting elements according to some embodiments of the present disclosure.

DETAILED DESCRIPTION

Figure 1:
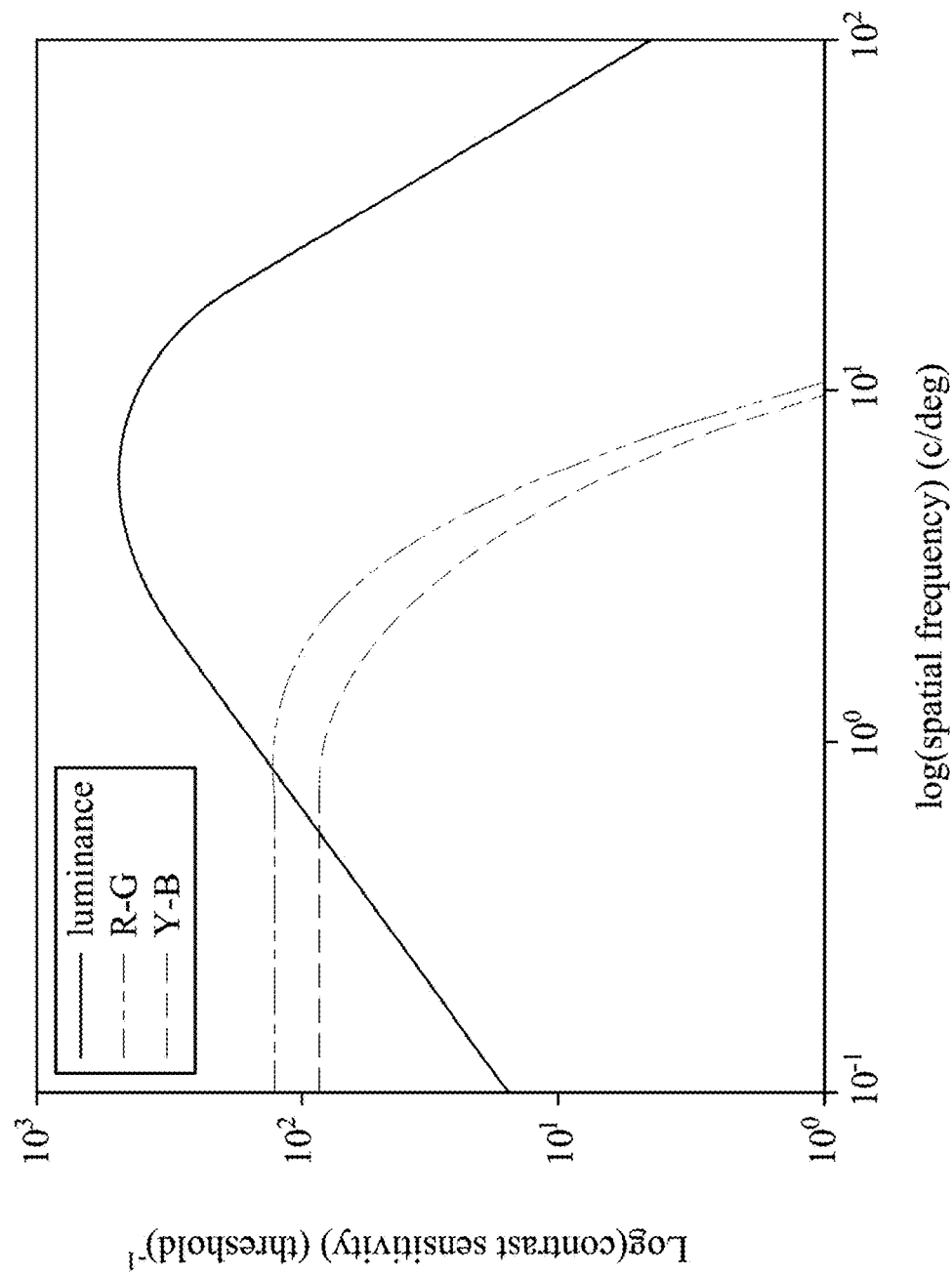
FIG. 1 shows the relationship between contrast sensitivity and spatial frequency.

Reference will now be made in detail to the present embodiments of the invention, examples of which are illustrated in the accompanying drawings. Wherever possible, the same reference numbers are used in the drawings and the description to refer to the same or like parts. Reference will now be made in detail to the present embodiments of the invention, examples of which are illustrated in the accompanying drawings. Wherever possible, the same reference numbers are used in the drawings and the description to refer to the same or like parts.

The terms "about" and "approximately" in the disclosure are used as equivalents. Any numerals used in this disclosure with or without "about," "approximately," etc. are meant to cover any normal fluctuations appreciated by one of ordinary skill in the relevant art. In certain embodiments, the term "approximately" or "about" refers to a range of values that fall within 20%, 10%, 5%, or less in either direction (greater or less than) of the stated reference value unless otherwise stated or otherwise evident from the context.

FIGS. 2A and 2B are cross-sectional views illustrating a display device 20a, 20b according to one comparative example of the invention. Please refer to FIG. 2A. The display device 20a includes a substrate 210, a red light-emitting element 222, a green light-emitting element 224, a blue light-emitting element 226, and a light-transmitting layer 230. The red light-emitting element 222, the green light-emitting element 224, and the blue light-emitting element 226 are arranged on the substrate 210, and the light-transmitting layer 230 fully covers the light-emitting elements 222, 224, 226 and the substrate 210.

The display device 20b shown in FIG. 2B is different from the display device 20a in that the display device 20b further includes a patterned light-absorbing wall 240 disposed on the substrate 210 and surrounding the red, green, and blue light-emitting element 222, 224, 226 and the light-transmitting layer 230. The patterned light-absorbing wall 240 surrounds one pixel. However, today's display device pursues miniaturization and the best display quality, so an improved display device is necessary to improve the problems of uniform color and high production costs.

Figure 3C:
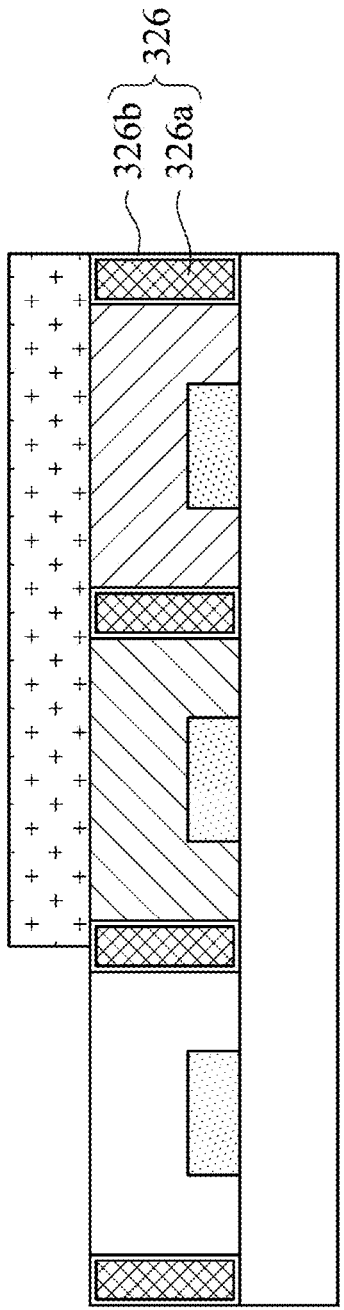

In order to improve the "mura effect" and the problem of production costs, one aspect of the present disclosure disclose provides display device as shown in FIGS. 3A-3G and 4-11. FIG. 3A is cross-sectional view illustrating a display device 30a according to some embodiments of the present disclosure. The display device 30a includes a substrate 310, a patterned wall 322, a first sub-pixel 330, a second sub-pixel 340, a third sub-pixel 350, and a first optical layer 362. In one embodiment, the substrate 310 may be a driving substrate. In some embodiments, the substrate 310 may be a passive substrate or an active substrate. Specifically, the passive substrate does not have an active element such as a thin film transistor, and is driven by voltages inputted by corresponding transverse and longitudinal wires. The active substrate is driven by the active element thereon such as a thin film transistor.

As shown in FIG. 3A, the patterned wall 322 is disposed on the substrate 310 and has a plurality of openings H1, H2, H3. In some embodiments, the patterned wall 322 includes at least one of a light-absorbing material and a light-reflecting material. Specifically, the light-absorbing material may be a black matrix (BM) resist that has light absorbing properties and enhances color contrast values. For example, the black matrix resist may be a metal chrome (Cr) black matrix resist, a resin type black matrix resist, or a graphite black matrix resist. The light-reflecting material may be a white resin or a metal that has light reflecting properties and does not leak light. For example, the white resin includes poly(methyl methacrylate) (PMMA), polyethylene terephthalate (PET), polystyrene (PS), polypropylene(PP), polyamide (PA), polycarbonate (PC), epoxy, silicon, etc. In another example, the metal may be silver, aluminum, rhodium, a silver alloy, and combinations thereof. In some embodiments, the light-reflecting material may be an oxide, such as $TiO_2$. In some embodiments, the light transmittance of the patterned wall 322 is less than 5%.

As shown in FIG. 3A, the first sub-pixel 330 is disposed in one of the openings and includes a first light-emitting element 332 and a first wavelength conversion layer 334. Specifically, the first sub-pixel 330 is disposed in the first opening H1, the first light-emitting element 332 is disposed on the substrate 310, and the first wavelength conversion layer 334 covers the first light-emitting element 332. In some embodiments, the first sub-pixel 330 is a blue sub-pixel. In some embodiments, the first light-emitting element 332 emits a light with a first wavelength. For example, the first light-emitting element 332 emits a blue light. In some embodiments, the first wavelength conversion layer 334 allows the light with the first wavelength to penetrate. In more detail, the first wavelength conversion layer 334 may include a light-transmissive resin, or the first wavelength conversion layer 334 is air.

As shown in FIG. 3A, the second sub-pixel 340 is disposed in one of the openings and includes a second light-emitting element 342 and a second wavelength conversion layer 344. Specifically, the second sub-pixel 340 is disposed in the second opening H2, the second light-emitting element 342 is disposed on the substrate 310, and the second wavelength conversion layer 344 covers the second light-emitting element 342. In some embodiments, the second sub-pixel 340 is a green sub-pixel. In some embodiments, the second light-emitting element 342 emits a light with a first wavelength. For example, the second light-emitting element 342 emits a blue light. In some embodiments, the second wavelength conversion layer 344 converts the light with the first wavelength into a light with a second wavelength. That is to say, the second wavelength conversion layer 344 may use to convert the blue light into a green light. In more detail, the second wavelength conversion layer 344 includes a green wavelength converting substance, and may further include green phosphor, green quantum dots (QDs), or a combination of the green phosphor and the green quantum dots. For example, the green phosphor may include β-SiAlON green phosphor, silicate green phosphor, YAG green phosphor, LuAG green phosphor, nitride series green phosphor, oxynitride series green phosphor, sulfide series green phosphor, fluoride series green phosphor, TAG green phosphor, NBG green phosphor, and phosphoric acid compound green phosphor. In an embodiment, the second wavelength conversion layer 344 further includes a light-transmissive resin mixed with the green wavelength converting substance. For example, the green quantum dots may include CdSe, CdS, CdTe, SInP, InN, AlInN, InGaN, AlGaInN, CuInGaSe, and an all-inorganic perovskite quantum dot with a chemical formula $CsPb(Br_{1-b}I_b)_3$, where $0 \le b < 0.5$.

As shown in FIG. 3A, the third sub-pixel 350 is disposed in one of the openings and includes a third light-emitting element 352 and a third wavelength conversion layer 354. Specifically, the third sub-pixel 350 is disposed in the third opening H3, the third light-emitting element 352 is disposed on the substrate 310, and the third wavelength conversion layer 354 covers the third light-emitting element 352. In some embodiments, the third sub-pixel 350 is a red sub-pixel. In some embodiments, the third light-emitting element 352 emits a light with a first wavelength. For example, the third light-emitting element 352 emits a blue light. In some embodiments, the third wavelength conversion layer 354 converts the light with the first wavelength into a light with a third wavelength. That is to say, the third wavelength conversion layer 354 may use to convert the blue light into a red light. In more detail, the third wavelength conversion layer 354 includes a red wavelength converting substance, and may further include red phosphor, red quantum dots (QDs), or a combination of the red phosphor and the red quantum dots. In an embodiment, the third wavelength conversion layer 354 further includes a light-transmissive resin mixed with the red wavelength converting substance. For example, the red phosphor is selected from a group consisting of $NaCd(WO_4)_2:Eu^{3+}$, $NaY(WO_4)_2:Eu^{3+}$, $NaLu(WO_4)_2:Eu^{3+}$, $SrAl(SO4)_2Br:Eu^{3+}$, $MgAl(SO4)_2Br:Eu^{3+}$, manganese-doped red fluoride phosphor, $Y_2O_3$:Eu, CaS:Eu, Tm, $Y_2O_2S$:Eu, Mg, Ti, $Gd_2SO_2S$:Eu, Mg, Ti, (Sr,Ca)$AlSiN_3$:Eu, and CaSrS:Eu. For example, the red quantum dots may include CdSe, and an all-inorganic perovskite quantum dot with a chemical formula $CsPb(Br_{1-b}I_b)_3$, where $0.5 \le b \le 1$.

In some embodiments, the first light-emitting element 332, the second light-emitting element 342, and the third light-emitting element 352 may be vertical light-emitting diodes or horizontal light-emitting diodes. In the embodiment of all the light-emitting elements being all vertical or horizontal light-emitting diodes, the first top surface of the first light-emitting element 332 substantially levels with a third top surface of the second light-emitting element 342, and the first top surface of the first light-emitting element 332 substantially levels with a fourth top surface of the third light-emitting element 352.

It is noted that a first distance D1 between a first top surface of the first light-emitting element 332 and a second top surface of the patterned wall 322 is about 10 um to about 100 um as shown in FIG. 3A. In other embodiments, a second distance D2 between a third top surface of the second light-emitting element 342 and a second top surface of the patterned wall 322 is about 10 um to about 100 um, and a third distance D3 between a fourth top surface of the third light-emitting element 352 and a second top surface of the patterned wall 322 is about 10 um to about 100 um. For example, the first distance D1, the second distance D2, and the third distance D3 may be independently 15 um, 20 um, 25 um, 30 um, 35 um, 40 um, 45 um, 50 um, 55 um, 60 um, 65 um, 70 um, 75 um, 80 um, 85 um, 90 um, or 95 um. This design can maximize the conversion efficiency of the wavelength conversion layers.

The first optical layer 362 is disposed on the patterned wall 322 and in direct contact with at least one of the first sub-pixel 330, the second sub-pixel 340, and the third sub-pixel 350. As shown in FIG. 3A, the first optical layer 362 is in direct contact with and covers the second sub-pixel 340 and the third sub-pixel 350, and the first optical layer 362 reflects or absorbs the lights with the first wavelength emitted from the second and third light-emitting elements 342, 352. In some embodiments, the first optical layer 362 is monolayer. In one embodiment, the first optical layer 362 may include a distributed bragg reflector (DBR). Specifically, the distributed bragg reflector may be formed by stacking two thin films of different or homogeneous materials. The first optical layer 362 can reflect the lights with the first wavelength emitted by the second and third light-emitting elements 342, 352, and the lights with the first wavelength respectively convert into the lights with the second wavelength and the third wavelength again through the wavelength conversion layers 344, 354. In another embodiment, the first optical layer 362 may be a color filter. In other embodiments, the first optical layer 362 may be an optical film or a plastic layer adding particles. For example, the plastic layer may be silicone, epoxy, poly(methyl methacrylate) (PMMA), polyethylene (PE), polyethylene terephthalate (PET), or polyimide (PI), and the particles may be $TiO_2$, $SiO_2$, $Al_2O_3$, BN, $ZrO_2$, $Ti_3O_5$, $Ta_2O_5$, $MgF_2$, Al, Ti, Ag, Au, $HFO_2$, and/or polymer ball, but not limited thereto. In the embodiment of using the color filter, the optical layer has characteristics of changing the light spectrum.

To make it easy to compare differences between various embodiments and simplify the descriptions, the same symbols are used to label the same members in the following various embodiments and mainly the differences between the various embodiments are described while duplicate parts are not described again.

FIG. 3B is a cross-sectional view illustrating a display device 30b according to some embodiments of the present disclosure. The difference between the display device 30b and the display device 30a is that the patterned wall 324 of display device 30b consists of two parts. To be specific, the patterned wall 324 of display device 30b consists of a first portion 324a and a second portion 324b, and the first portion 324a is disposed on the second portion 324b. It is noted that the material of the first portion 324a is different from that of the second portion 324b. More specifically, the first portion 324a may include light-absorbing materials, and the second portion 324b may include light-reflecting materials. In some embodiments, a top surface of the second portion 324b must be higher than a top surface of a light-emitting element. This design can reduce the absorption of the light source by the patterned wall and increase the light intensity.

FIG. 3C is a cross-sectional view illustrating a display device 30c according to some embodiments of the present disclosure. The difference between the display device 30c and the display device 30a is that the patterned wall 326 of display device 30c consists of two parts. To be specific, the patterned wall 326 of display device 30c consists of a first portion 326a and a second portion 326b, and the first portion 326a is completely encapsulated by the second portion 326b. It is noted that the material of the first portion 326a is different from that of the second portion 326b. More specifically, the first portion 326a may include light-absorbing materials, and the second portion 326b may include light-reflecting materials. This design can be used to reflect the light source, thereby increasing the light intensity.

Figure 3D:
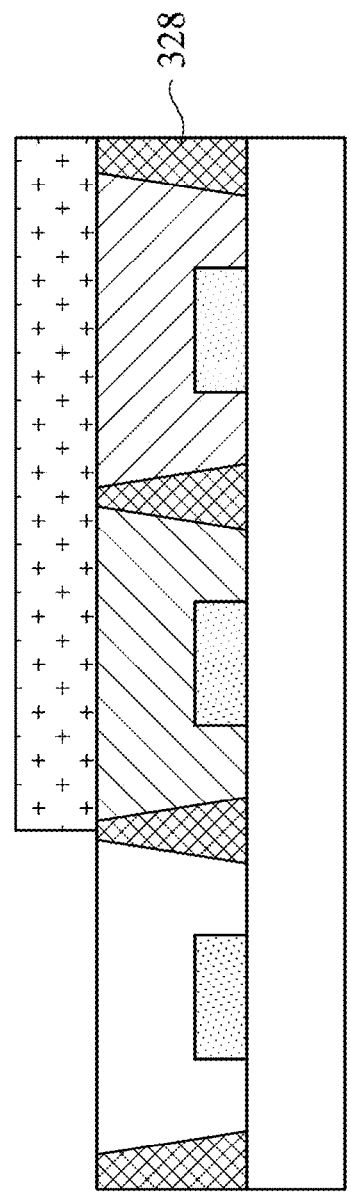

FIG. 3D is a cross-sectional view illustrating a display device 30d according to some embodiments of the present disclosure. The difference between the display device 30d and the display device 30a is that the profile of the patterned wall 328 is a trapezoidal. More specifically, the upper surface of the patterned wall 328 is smaller than the lower surface thereof. This design can be used to adjust the light-emitting pattern.

FIG. 3E is a cross-sectional view illustrating a display device 30e according to some embodiments of the present disclosure. The difference between the display device 30e and the display device 30d is that the upper side of the patterned wall 329 is larger than the lower side thereof. This design can be used to adjust the light-emitting pattern.

FIG. 3F is a cross-sectional view illustrating a display device 30f according to some embodiments of the present disclosure. The difference between the display device 30f and the display device 30a is that the first optical layer 366 fully covers the first sub-pixel 330, the second sub-pixel 340 and the third sub-pixel 350. More specifically, the first optical layer 366 includes a first portion 366a and a second portion 366b, the first portion 366a is disposed on the first sub-pixel 330, and the second portion 366b is disposed on the second and third sub-pixels 340, 350. To be more detail, the first portion 366a is used to allow the light emitted from first light-emitting element 332 to penetrate, so the first portion 366a may include transparent materials, such as glass or transparent epoxy resins, but not limited thereto. The function of the second portion 366b of the first optical layer 366 is similar to that of the first optical layer 362 of the display device 30a. Therefore, the second portion 366b may be a color filter, an optical film, a plastic layer adding particles, or the second portion 366b may also include a distributed bragg reflector.

FIG. 3G is a cross-sectional view illustrating a display device 30g according to some embodiments of the present disclosure. The difference between the display device 30g and the display device 30a is that the display device 30g further includes a second optical layer 364 disposed between the patterned wall 322 and the first optical layer 362. More specifically, the second optical layer 364 is disposed between the first, second, third sub-pixels 330, 340, 350 and the first optical layer 362. In one embodiment, the second optical layer 364 may be an optical film or a plastic layer adding particles. For example, the plastic layer may be silicone, epoxy, poly(methyl methacrylate) (PMMA), polyethylene (PE), polyethylene terephthalate (PET), or polyimide (PI), and the particles may be $TiO_2$, $SiO_2$, $Al_2O_3$, $ZrO_2$, $Ti_3O_5$, $Ta_2O_5$, $MgF_2$, Al, Ti, Ag, Au, $HFO_2$, and/or polymer ball, but not limited thereto. In another embodiment, the second optical layer 364 may be a color filter. In the embodiment of using the color filter, the optical layer has characteristics of changing the light spectrum. Although the number of the optical layers shown in FIG. 3G is 2, the number of the optical layers may be increased to 3, 4, or 5 according to requirements.

FIG. 4 illustrates a display device 40 according to some embodiments of the present disclosure. The difference between the display device 40 and the display device 30a of the previous embodiment is that, in this embodiment, the first sub-pixel 430 includes a first light-emitting element 432 and a first wavelength conversion layer 434, and the optical layer 462 fully covers the first sub-pixel 430, the second sub-pixel 340 and the third sub-pixel 350. Specifically, the first sub-pixel 430 is still a blue sub-pixel. In this embodiment, the first light-emitting element 432 emits an ultraviolet light, and the first wavelength conversion layer 434 converts the ultraviolet light into a blue light. In more detail, the first wavelength conversion layer 434 includes a blue wavelength converting substance, and may further include blue phosphors, blue quantum dots, or a combination of the blue phosphor and the blue quantum dots. For example, the blue phosphors are selected from a group consisting of $Sr_4Al_{14}O_{25}$:Eu, Dy, $CaAl_2O_4$:Eu, and Nd. For example, the blue quantum dots may include an all-inorganic perovskite quantum dot with a chemical formula $CsPb(Cl_aBr_{1-a})_3$, where $0<a\leq1$. The material and other features of the optical layer 462 may be the same or similar to the first optical layer 362 shown in FIG. 3A, and so will not be described here. Furthermore, the display device 40 may further include another optical layer (not shown) disposed between the optical layer 462 and the first, second and third sub-pixels 430, 340, 350. The material and other features of the another optical layer may be the same or similar to the second optical layer 364 shown in FIG. 3G, and so will not be described here.

FIG. 5 illustrates a display device 50 according to some embodiments of the present disclosure. The difference between the display device 50 and the display device 30*a* of the previous embodiment is that, in this embodiment, the second sub-pixel 540 includes a second light-emitting element 542 and a second wavelength conversion layer 544, and the optical layer 562 only covers the third sub-pixel 350. Specifically, the second sub-pixel 540 is still a green sub-pixel. In this embodiment, the second light-emitting element 542 emits a green light, and the second wavelength conversion layer 544 allows the green light to penetrate. In more detail, the second wavelength conversion layer 544 includes a light-transmissive resin, or the second wavelength conversion layer 544 is air. The material and other features of the optical layer 562 may be the same or similar to the first optical layer 362 shown in FIG. 3A, and so will not be described here. Furthermore, the display device 50 may further include another optical layer (not shown) disposed between the optical layer 562 and the first, second and third sub-pixels 330, 540, 350. The material and other features of the another optical layer may be the same or similar to the second optical layer 364 shown in FIG. 3G, and so will not be described here.

FIG. 6 illustrates a display device 60 according to some embodiments of the present disclosure. The difference between the display device 60 and the display device 30*a* of the previous embodiment is that, in this embodiment, the third sub-pixel 650 includes a third light-emitting element 652 and a third wavelength conversion layer 654, and the optical layer 662 only covers the second sub-pixel 340. Specifically, the third sub-pixel 650 is still a red sub-pixel. In this embodiment, the third light-emitting element 652 emits a red light, and the third wavelength conversion layer 654 allows the red light to penetrate. In more detail, the third wavelength conversion layer 654 includes a light-transmissive resin, or the third wavelength conversion layer 654 is air. The material and other features of the optical layer 662 may be the same or similar to the first optical layer 362 shown in FIG. 3A, and so will not be described here. Furthermore, the display device 60 may further include another optical layer (not shown) disposed between the optical layer 662 and the first, second and third sub-pixels 330, 340, 650. The material and other features of the another optical layer may be the same or similar to the second optical layer 364 shown in FIG. 3G, and so will not be described here.

FIG. 7 illustrates a display device 70 according to some embodiments of the present disclosure. The difference between the display device 70 and the display device 40 of the previous embodiment is that, in this embodiment, the second sub-pixel 740 includes a second light-emitting element 742 and a second wavelength conversion layer 744, the third sub-pixel 750 includes a third light-emitting element 752 and a third wavelength conversion layer 754, and the optical layer 762 only covers the first sub-pixel 430. Specifically, the second sub-pixel 740 is a green sub-pixel, and the third sub-pixel 750 is a red sub-pixel. In this embodiment, the second light-emitting element 742 emits a green light, and the second wavelength conversion layer 744 allows the green light to penetrate. In this embodiment, the third light-emitting element 752 emits a red light, and the third wavelength conversion layer 754 allows the red light to penetrate. In more detail, the second wavelength conversion layer 744 and the third wavelength conversion layer 754 independently includes a light-transmissive resin, or the second wavelength conversion layer 744 and the third wavelength conversion layer 754 are air. The material and other features of the optical layer 762 may be the same or similar to the optical layer 462 shown in FIG. 4, and so will not be described here. Furthermore, the display device 70 may further include another optical layer (not shown) disposed between the optical layer 762 and the first, second and third sub-pixels 430, 740, 750. The material and other features of the another optical layer may be the same or similar to the second optical layer 364 shown in FIG. 3G, and so will not be described here.

FIG. 8 illustrates a display device 80 according to some embodiments of the present disclosure. The difference between the display device 80 and the display device 30*a* of the previous embodiment is that, in this embodiment, the patterned wall 822 has two openings H4, H5, the first and second sub-pixels 830, 840 are disposed in the fourth opening H4, the third sub-pixel 350 is disposed in the fifth opening H5, and the optical layer 862 only covers the third sub-pixel 350. In this embodiment, the size of the opening H4 is greater than that of the opening H5. The "size" herein refers to the dimension of the length and the width of the element in the top view. The material and other features of the patterned wall 822 may be the same or similar to the patterned wall 322 shown in FIG. 3A, and so will not be described here. In this embodiment, the first sub-pixel 830 is a blue sub-pixel, and second sub-pixel 840 is a green sub-pixel. To be specific, the first light-emitting element 832 emits a blue light, and the second light-emitting element 842 emits a green light. The second wavelength conversion layer 834 and the second wavelength conversion layer 844 are formed to be a continuous layer. The continuous layer allows the blue light and the green light to penetrate. Therefore, the material and other features of the continuous layer may be the same or similar to the first wavelength conversion layer 334 shown in FIG. 3A, and so will not be described here. The material and other features of the optical layer 862 may be the same or similar to the first optical layer 362 shown in FIG. 3A, and so will not be described here. Furthermore, the display device 80 may further include another optical layer (not shown) disposed between the optical layer 862 and the first, second and third sub-pixels 830, 840, 350. The material and other features of the another optical layer may be the same or similar to the second optical layer 364 shown in FIG. 3G, and so will not be described here.

Figure 9:
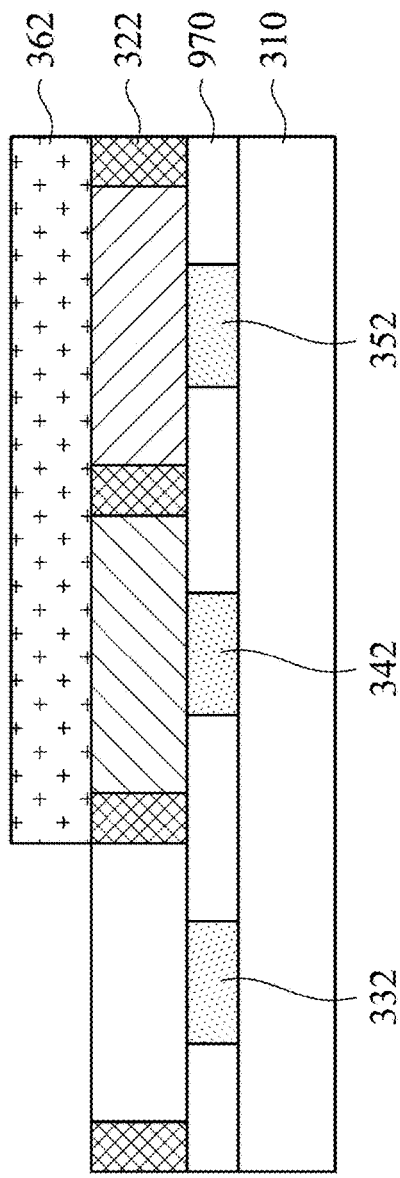

FIG. 9 illustrates a display device 90 according to some embodiments of the present disclosure. The difference between the display device 90 and the display device 30*a* of the previous embodiment is that, in this embodiment, the display device 90 further includes a planarization layer 970 disposed between the substrate 310 and the patterned wall 322. Specifically, the first, second, and third light-emitting elements 332, 342, 352 are embedded in the planarization layer 970. Due to the bonding of the light-emitting elements on the substrate, the surface will be uneven, a planarization layer is needed to compensate for the uneven surface, which is beneficial to the subsequent processes. In some embodiments, an upper surface of the planarization layer 970 substantially levels with top surfaces of the first, second, and third light-emitting elements 332, 342, and 352 as shown in FIG. 9. In other embodiments, an upper surface of the planarization layer 970 may be higher than top surfaces of the first, second, and third light-emitting elements 332, 342, and 352. The planarization layer 970 may include transparent materials or light-reflecting materials. For example, the transparent materials include white resins, such as poly (methyl methacrylate) (PMMA), polyethylene terephthalate (PET), polystyrene (PS), polypropylene(PP), polyamide (PA), polycarbonate (PC), epoxy, and silicon, or include metals, such as silver, aluminum, rhodium, a silver alloy, and combinations thereof.

Figure 10:
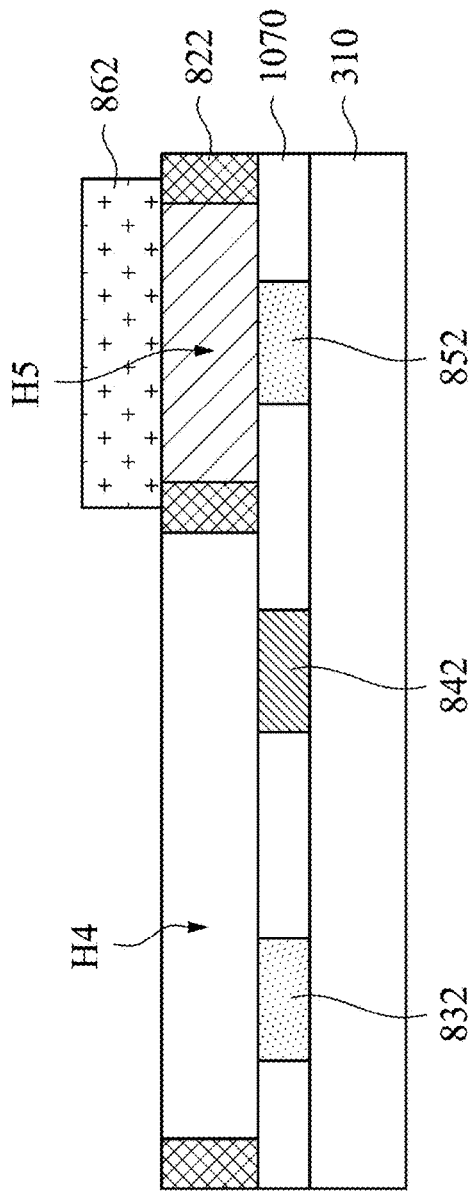

FIG. 10 illustrates a display device 1000 according to some embodiments of the present disclosure. The difference between the display device 1000 and the display device 80 of the previous embodiment is that, in this embodiment, the display device 1000 further includes a planarization layer 1070 disposed between the substrate 310 and the patterned wall 822. The material and other features of the planarization layer 1070 may be the same or similar to the planarization layer 970 shown in FIG. 9, and so will not be described here.

Figure 11:
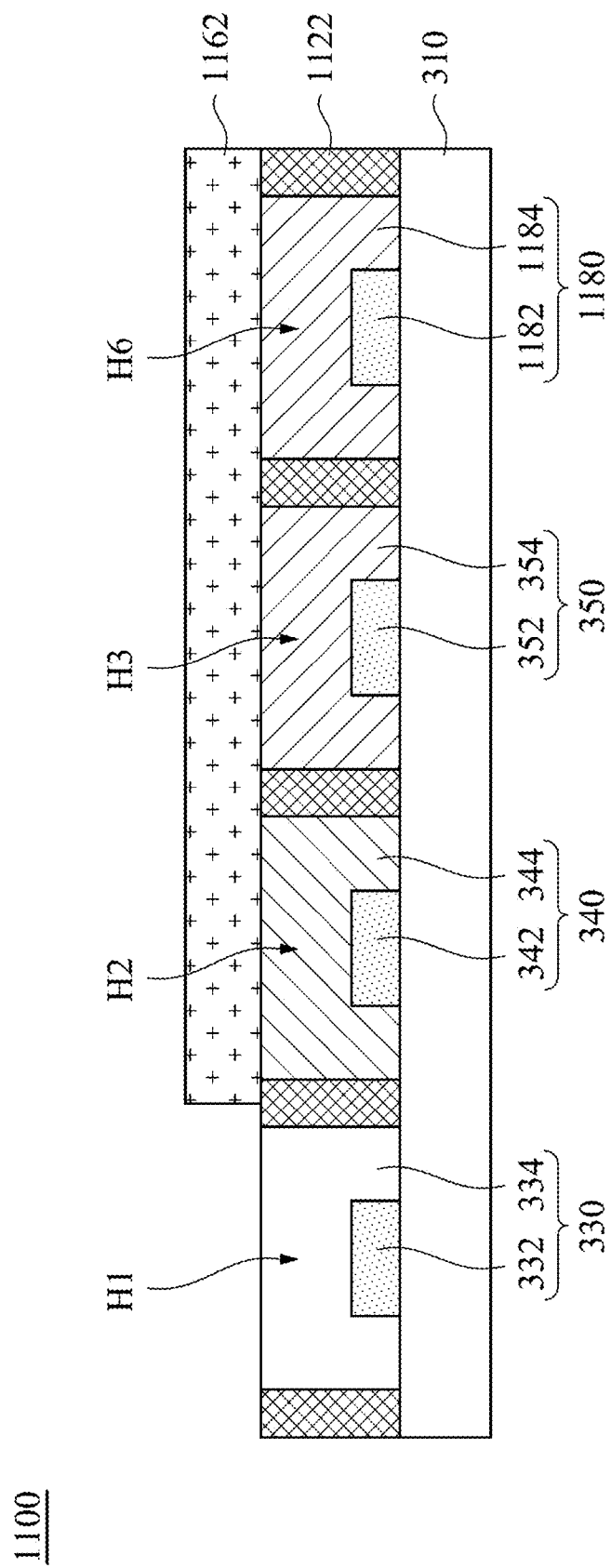

FIG. 11 illustrates a display device 1100 according to some embodiments of the present disclosure. The difference between the display device 1100 and the display device 30a of the previous embodiment is that, in this embodiment, the display device 1100 further includes a fourth sub-pixel 1180 disposed in one of the openings of the patterned wall 1122. Specifically, the patterned wall 1122 has four openings H1, H2, H3, and H6, and the fourth sub-pixel 1180 is disposed in the sixth opening H6 as shown in FIG. 11. The fourth sub-pixel 1180 includes a fourth light-emitting element 1182 and a fourth wavelength conversion layer 1184. The fourth light-emitting element 1182 is disposed on the substrate 310, and the fourth wavelength conversion layer 1184 covers the fourth light-emitting element 1182. In various embodiments, the first, second, third, and fourth sub-pixels 330, 340, 350, and 1180 are red sub-pixels, blue sub-pixels, green sub-pixels, white sub-pixels, yellow sub-pixels, or a combination thereof. Although the number of the sub-pixels shown in FIG. 11 is 4, the number of the sub-pixels may be increased to 5 or 6 according to requirements.

FIGS. 12A to 12H are top views illustrating the arrangement of light-emitting elements according to some embodiments of the present disclosure. In various embodiments, the first, second, third, and fourth light-emitting elements 332, 342, 352, and 1182 may be red light-emitting elements, blue light-emitting elements, green light-emitting elements, white light-emitting elements, or a combination thereof. The present disclosure utilizes the light-emitting elements above with different combinations to mix the three primary colors of light (red, green, and blue) to emit white light. For example, the display device may include one red light-emitting element R, one green light-emitting element G, and one blue light-emitting element B arranged as shown in FIGS. 12A and 12B.

For another example, the display device may include two red light-emitting elements R1, R2, one green light-emitting element G, and one blue light-emitting element B arranged as shown in FIGS. 12C and 12D. This design can increase color gamut (NTSC or BT. 2020 (Rec. 2020)) of the display device. In an embodiment, the two red light-emitting elements R1, R2 may respectively have different wavelength bands for better red light color rendering effect. In another embodiment, the two light-emitting elements R1, R2 may have the same wavelength band but have different brightness levels for better modulation in brightness.

For another example, the display device may include one red light-emitting element R, two green light-emitting elements G1, G2, and one blue light-emitting element B arranged as shown in FIGS. 12E and 12F. This design can increase the overall brightness of the display device.

For example, the display device may include one red light-emitting element R, one green light-emitting element G, one blue light-emitting element B, and one white light-emitting element W arranged as shown in FIGS. 12G and 12H. Since there is a white light-emitting element W added in this design, display brightness can be improved when a backlight module with a same power is used. In other words, if a same brightness output is required, the power consumption of this design will be lower.

Figure 13A:
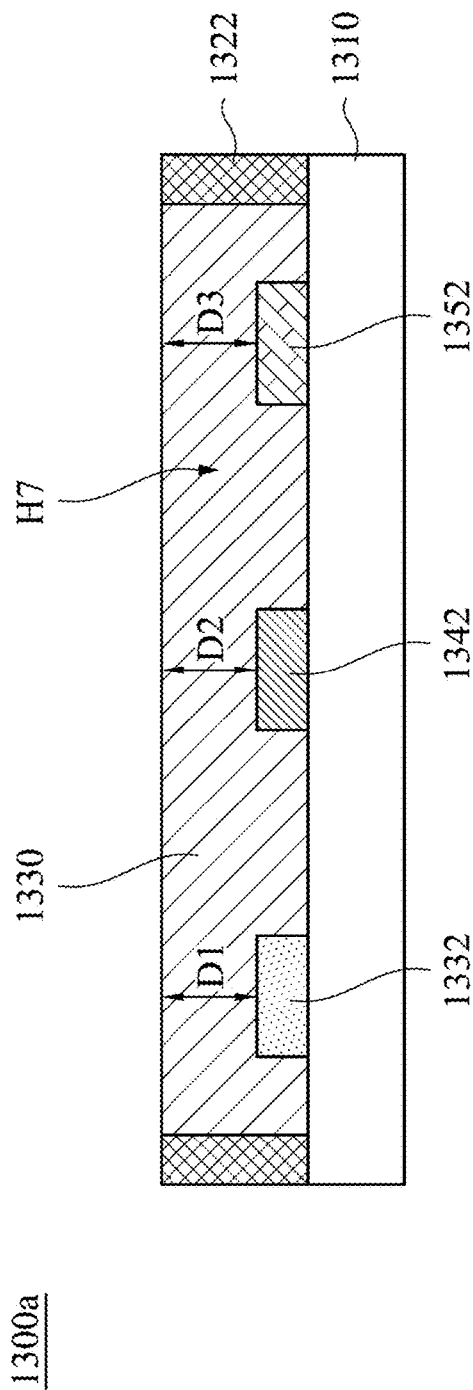
FIGS. 13A, 13B, 14, 15, and 16 illustrate a display device according to some embodiments of the present disclosure.

In order to improve the "mura effect" and the problem of production costs, another aspect of the present disclosure disclose provides display device as shown in FIGS. 13A, 13B, and 14-16. FIG. 13A is a cross-sectional view illustrating a display device 1300a according to some embodiments of the present disclosure. The display device 1300a includes a substrate 1310, a patterned wall 1322, a first light-emitting element 1332, a second light-emitting element 1342, a third light-emitting element 1352, a wavelength conversion layer 1330. In some embodiments, the substrate 1310 may be a passive substrate, an active substrate, or a driving substrate. Specifically, the passive substrate does not have an active element such as a thin film transistor, and is driven by voltages inputted by corresponding transverse and longitudinal wires. The active substrate is driven by the active element thereon such as a thin film transistor.

As shown in FIG. 13A, the patterned wall 1322 is disposed on the substrate 1310 and has an opening H7. In some embodiments, the patterned wall 1322 includes at least one of a light-absorbing material and a light-reflecting material. Specifically, the light-absorbing material may be a black matrix (BM) resist that has light absorbing properties and enhances color contrast values. For example, the black matrix resist may be a metal chrome (Cr) black matrix resist, a resin type black matrix resist, or a graphite black matrix resist. The light-reflecting material may be a white resin or a metal that has light reflecting properties and does not leak light. For example, the white resin includes poly(methyl methacrylate) (PMMA), polyethylene terephthalate (PET), polystyrene (PS), polypropylene(PP), polyamide (PA), polycarbonate (PC), epoxy, silicon, etc. In another example, the metal may be silver, aluminum, rhodium, a silver alloy, and combinations thereof.

As shown in FIG. 13A, the first light-emitting element 1332, the second light-emitting element 1342, and the third light-emitting element 1352 are disposed in the opening H7 and on the substrate 1310. In one embodiment, the first light-emitting element 1332 emit a light with a first wavelength, the second light-emitting element 1342 emit a light with a second wavelength, and the third light-emitting element emit 1352 a light with a third wavelength. Specifically, the first light-emitting element 1332, the second light-emitting element 1342, and the third light-emitting element 1352 respectively emits a blue light, a green light and an ultraviolet light.

In some embodiments, the first light-emitting element 1332, the second light-emitting element 1342, and the third light-emitting element 1352 may be vertical light-emitting diodes or horizontal light-emitting diodes. In the embodiment of all the light-emitting elements being all vertical or horizontal light-emitting diodes, the first top surface of the first light-emitting element 1332 substantially levels with a third top surface of the second light-emitting element 1342, and the first top surface of the first light-emitting element 1332 substantially levels with a fourth top surface of the third light-emitting element 1352.

It is noted that a first distance D1 between a first top surface of the first light-emitting element 1332 and a second top surface of the patterned wall 1322 is about 10 um to about 100 um as shown in FIG. 13A. In other embodiments, a second distance D2 between a third top surface of the second light-emitting element 1342 and a second top surface of the patterned wall 1322 is about 10 um to about 100 um, and a third distance D3 between a fourth top surface of the third light-emitting element 1352 and a second top surface of the patterned wall 1322 is about 10 um to about 100 um. For example, the first distance D1, the second distance D2, and the third distance D3 may be independently 15 um, 20 um, 25 um, 30 um, 35 um, 40 um, 45 um, 50 um, 55 um, 60 um, 65 um, 70 um, 75 um, 80 um, 85 um, 90 um, or 95 um. This design can maximize the conversion efficiency of the wavelength conversion layer.

In various embodiments, the number of the light-emitting elements is not limited to 3, the number of the light-emitting elements may be increased to 4, 5 or 6 according to requirements. The present disclosure utilizes these light-emitting elements with different combinations to mix the three primary colors of light (red, green, and blue) to emit white light. The different combinations and the arrangements of these light-emitting elements may be the same or similar to the light-emitting elements shown in FIGS. 12A-12H, and so will not be described here.

As shown in FIG. 13A, the wavelength conversion layer 1330 is disposed in the opening H7 and covers the first, second, and third light-emitting elements 1332, 1342, 1352. In some embodiments, the wavelength conversion layer 1330 converts the light with the third wavelength into a light with a fourth wavelength or converts the light with the second wavelength into a light with a fifth wavelength. In this embodiment, the wavelength conversion layer 1330 converts the ultraviolet light emitted from the third light-emitting element 1352 into a red light. In more detail, the wavelength conversion layer 1330 includes a red wavelength converting substance, and may further include red phosphor, red quantum dots (QDs), or a combination of the red phosphor and the red quantum dots. In an embodiment, the wavelength conversion layer 1330 further includes a light-transmissive resin mixed with the red wavelength converting substance. For example, the red phosphor is selected from a group consisting of $NaCd(WO_4)_2:Eu^{3+}$, $NaY(WO_4)_2:Eu^{3+}$, $NaLu(WO_4)_2:Eu^{3+}$, $SrAl(SO4)_2Br:Eu^{3+}$, $MgAl(SO4)_2Br:Eu^{3+}$, manganese-doped red fluoride phosphor, $Y_2O_3:Eu$, $CaS:Eu$, Tm, $Y_2O_2S:Eu$, Mg, Ti, $Gd_2SO_2S:$Eu, Mg, Ti, $(Sr,Ca)AlSiN_3:Eu$, and $CaSrS:Eu$. For example, the red quantum dots may include CdSe, and an all-inorganic perovskite quantum dot with a chemical formula $CsPb(Br_{1-b}I_b)_3$, where $0.5 \leq b \leq 1$.

Figure 13B:
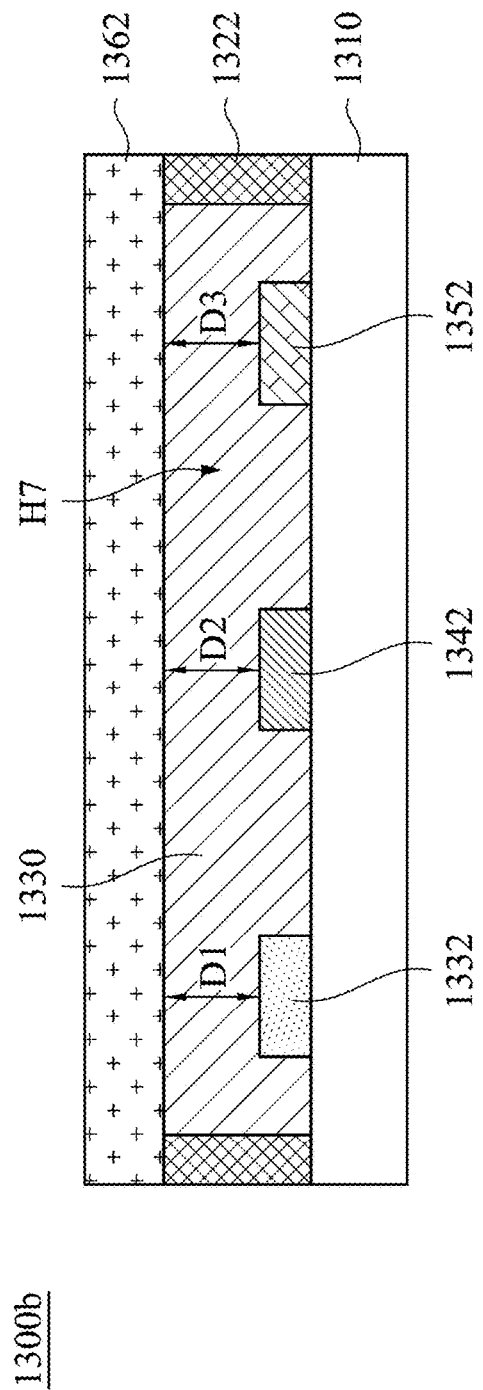

FIG. 13B is a cross-sectional view illustrating a display device 1300b according to some embodiments of the present disclosure. The difference between the display device 1300b and the display device 1300a of the previous embodiment is that, in this embodiment, the display device 1300b further includes an optical layer 1362. The optical layer 1362 is disposed on the patterned wall 1322 and in direct contact with the wavelength conversion layer 1330. Specifically, the optical layer 1362 reflects or absorbs the light with the third wavelength emitted from the third light-emitting element 1352. In some embodiments, the optical layer 1362 includes a monolayer or a multilayer. In the embodiment of the optical layer including the monolayer, the material and other features of the optical layer 1362 may be the same or similar to the first optical layer 362 shown in FIG. 3A, and so will not be described here. In the embodiment of the optical layer including the multilayer, the display device 1300b may further include single, double, tribble, or more another optical layer(s) (not shown) disposed between the optical layer 1362 and the wavelength conversion layer 1330. The material and other features of the another optical layer(s) may be the same or similar to the second optical layer 364 shown in FIG. 3G, and so will not be described here. The design as shown in FIG. 13b not only simplifies the packaging, but also achieves the effect of uniformcolor.

Figure 14:
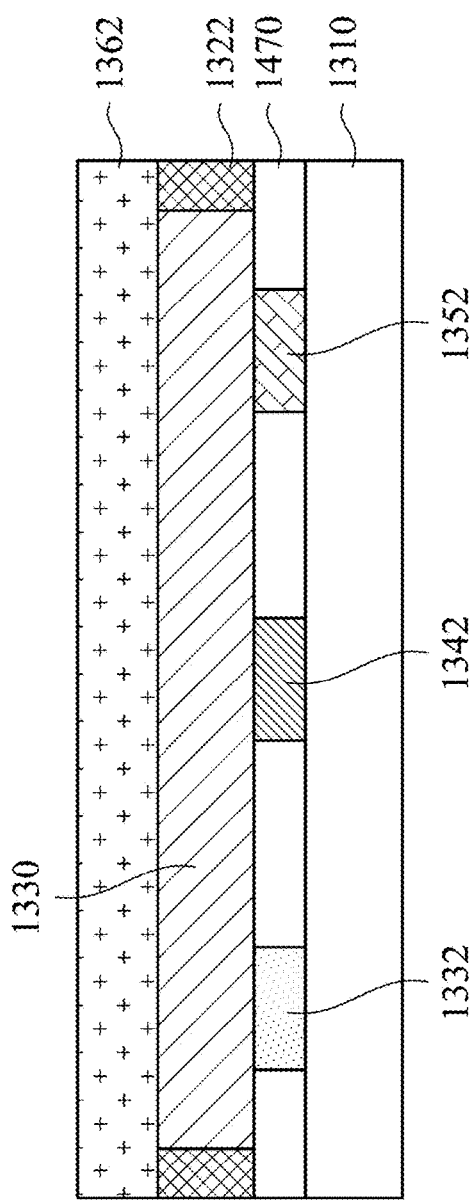

FIG. 14 illustrates a display device 1400 according to some embodiments of the present disclosure. The difference between the display device 1400 and the display device 1300b of the previous embodiment is that, in this embodiment, the display device 1400 further includes a planarization layer 1470 disposed between the substrate 1310 and the patterned wall 1322. Specifically, the first, second, and third light-emitting elements 1332, 1342, and 1352 are embedded in the planarization layer 1470. In some embodiments, an upper surface of the planarization layer 1470 substantially levels with top surfaces of the first, second, and third light-emitting elements 1332, 1342, 1352 as shown in FIG. 14. In another embodiment, an upper surface of the planarization layer 1470 is higher than top surfaces of the first, second, and third light-emitting elements 1332, 1342, 1352. In other embodiments, the planarization layer 1470 covers the first, second, and third light-emitting elements 1332, 1342, 1352. The planarization layer 1470 may include transparent materials or light-reflecting materials. For example, the transparent materials include white resins, such as poly(methyl methacrylate) (PMMA), polyethylene terephthalate (PET), polystyrene (PS), polypropylene(PP), polyamide (PA), polycarbonate (PC), epoxy, and silicon, or include metals, such as silver, aluminum, rhodium, a silver alloy, and combinations thereof. It is noted that the optical layer 1362 is optionally disposed in the display device 1400.

Figure 15:
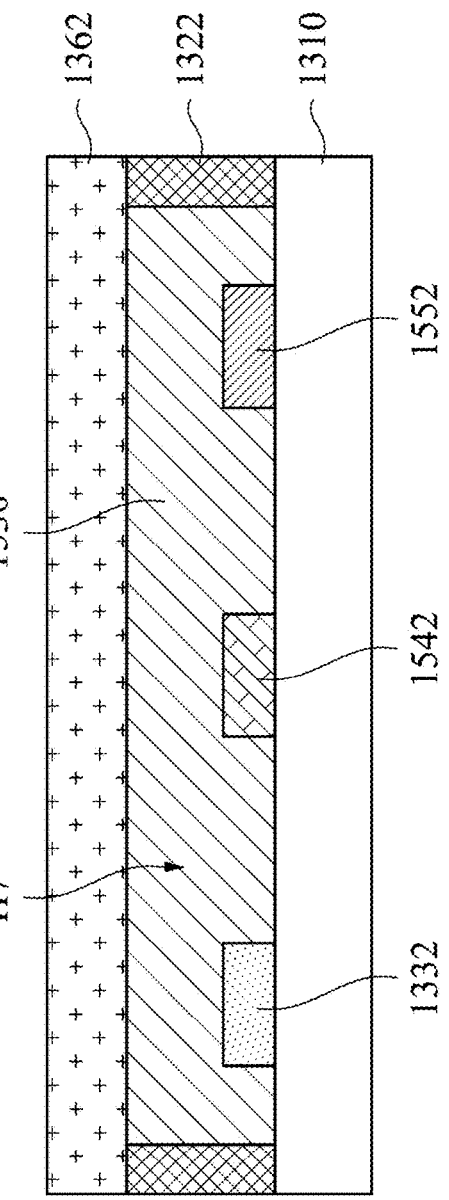

FIG. 15 illustrates a display device 1500 according to some embodiments of the present disclosure. The difference between the display device 1500 and the display device 1300b of the previous embodiment is that, in this embodiment, the first light-emitting element 1332, the second light-emitting element 1542, and the third light-emitting element 1552 respectively emits a blue light, an ultraviolet light and a red light, and the wavelength conversion layer 1530 is used to convert the ultraviolet light emitted from the second light-emitting element 1542 into a green light. In more detail, the wavelength conversion layer 1530 includes a green wavelength converting substance, and may further include green phosphor, green quantum dots (QDs), or a combination of the green phosphor and the green quantum dots. For example, the green phosphor may include β-SiAlON green phosphor, silicate green phosphor, YAG green phosphor, LuAG green phosphor, nitride series green phosphor, oxynitride series green phosphor, sulfide series green phosphor, fluoride series green phosphor, TAG green phosphor, NBG green phosphor, and phosphoric acid compound green phosphor. In an embodiment, the wavelength conversion layer 1530 further includes a light-transmissive resin mixed with the green wavelength converting substance. For example, the green quantum dots may include CdSe, CdS, CdTe, SlnP, InN, AlInN, InGaN, AlGaInN, CuInGaSe, and an all-inorganic perovskite quantum dot with a chemical formula $CsPb(Br_{1-b}I_b)_3$, where $0 \leq b < 0.5$. It is noted that the optical layer 1362 is optionally disposed in the display device 1500.

Figure 16:
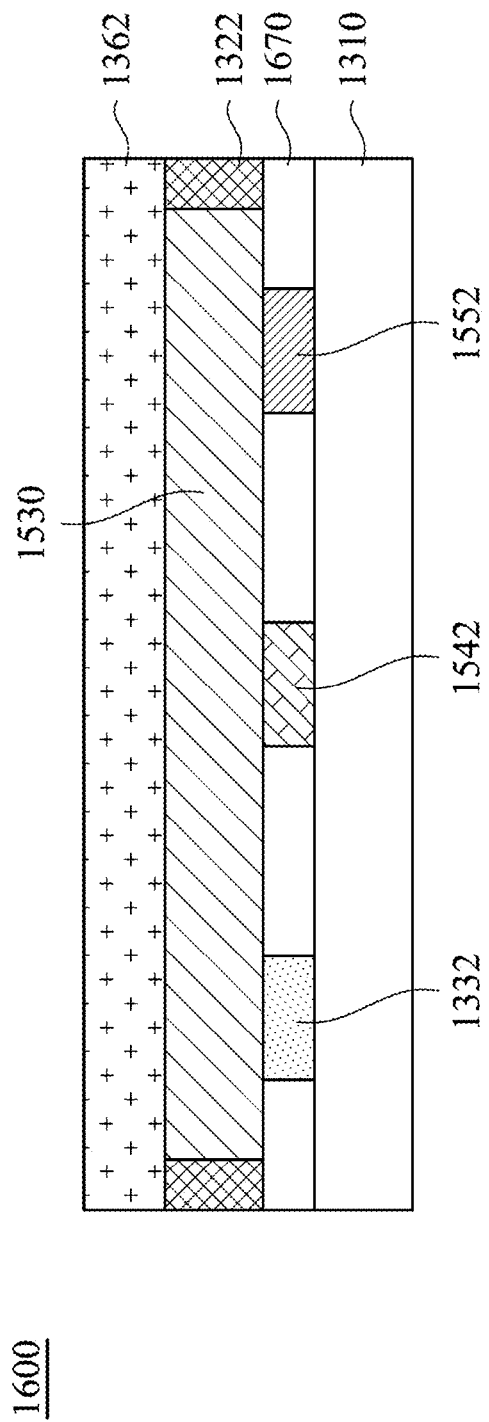

FIG. 16 illustrates a display device 1600 according to some embodiments of the present disclosure. The difference between the display device 1600 and the display device 1500 of the previous embodiment is that, in this embodiment, the display device 1600 further includes a planarization layer 1670 disposed between the substrate 1310 and the patterned wall 1322. The material and other features of the planarization layer 1670 may be the same or similar to the planarization layer 1470 shown in FIG. 14, and so will not be described here. It is noted that the optical layer 1362 is optionally disposed in the display device 1600.

As is apparent from the above detailed description, the design of the display device according to the invention can achieve a single pixel uniform color mixing effect and prevent the "mura effect". Moreover, some designs of the present invention use the light-emitting elements with similar driving voltages as the first light source, so as to make the driving voltages consistent, thereby reducing the electrical differences of the red, green, and blue sub-pixels and solving the problem of production costs.

Figure 17A:
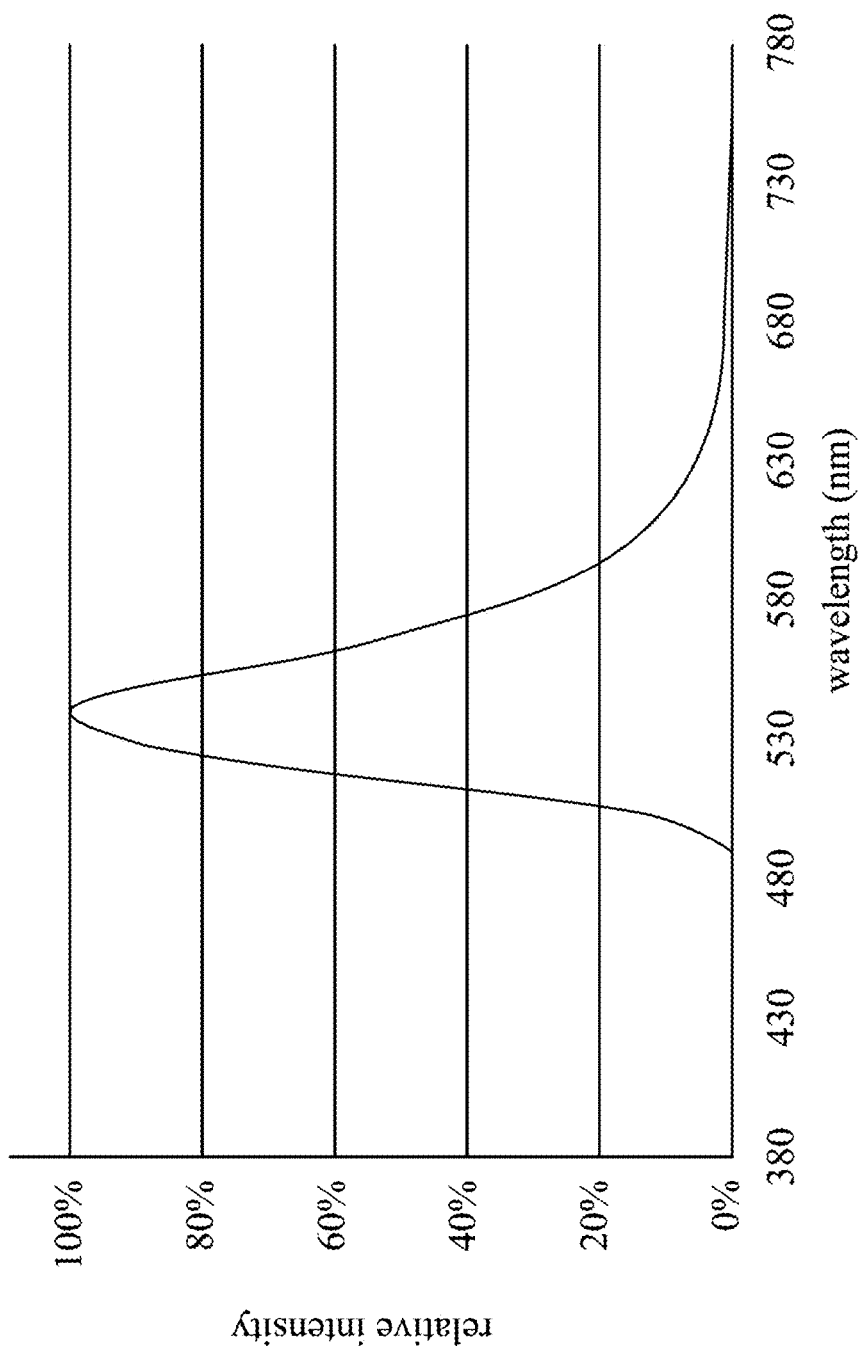
FIG. 17A is an emission intensity distribution of green light according to one example of the present disclosure.
Figure 17B:
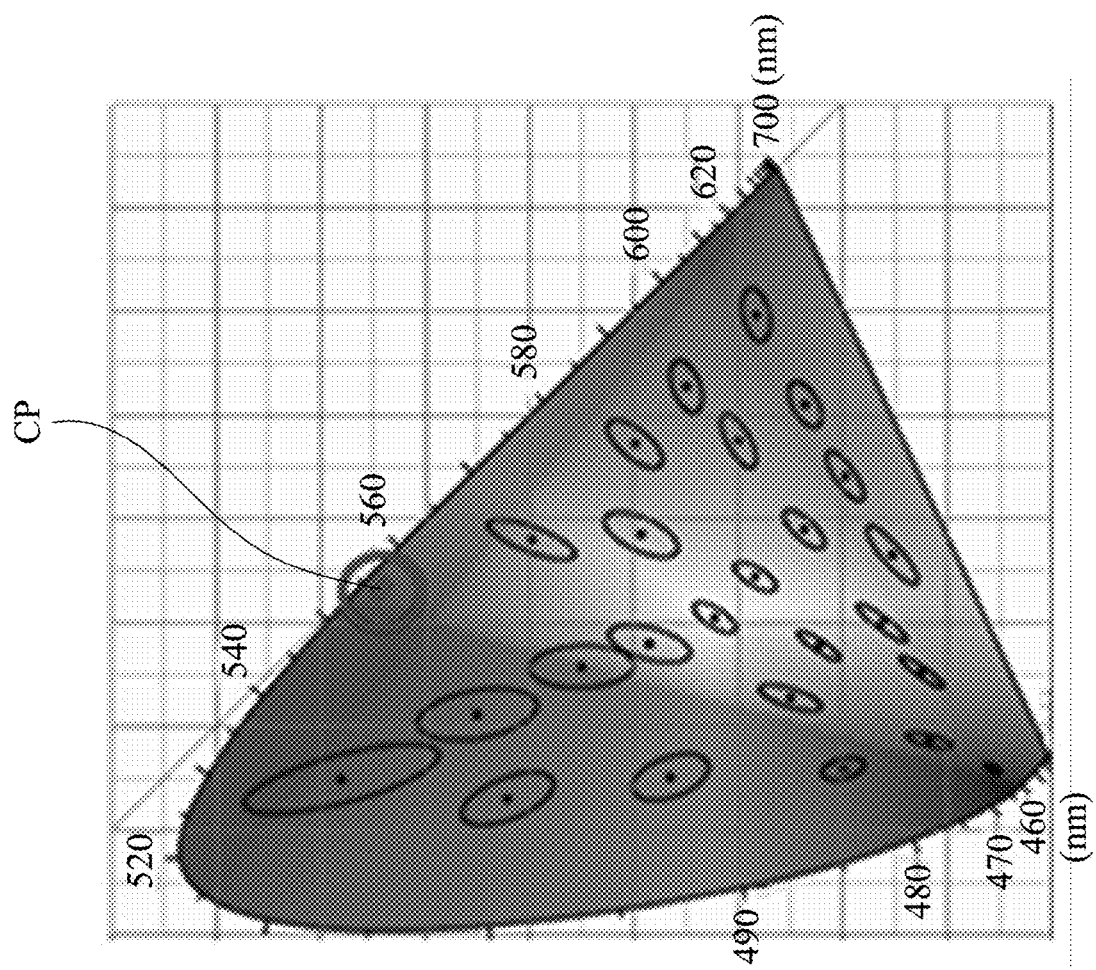
FIG. 17B shows the CIE 1931 color space chromaticity diagram.

FIG. 17A is an emission intensity distribution of green light according to one example of the present disclosure. FIG. 17B shows the CIE 1931 color space chromaticity diagram. In one example, when the wavelength conversion layer includes β-SiAlON green phosphor, after exciting the wavelength conversion layer using an excitation light source with a wavelength of 390 nm, the light source obtained after conversion by the wavelength conversion layer has a spectrum as shown in FIG. 17A. In other examples, when the wavelength conversion layer includes β-SiAlON green phosphor, after exciting the wavelength conversion layer using an excitation light source with a wavelength of 400 nm, 410 nm, 420 nm, 430 nm, 440 nm, 450 nm, 460 nm, 470 nm, or 480 nm, the light source obtained after conversion by the wavelength conversion layer also has a spectrum similar to FIG. 17A. The spectrum shown in FIG. 17A may correspond to the color point CP shown in FIG. 17B. The spectrum of the light source obtained after conversion by the wavelength conversion layer does not change much, even if the excitation light source with a wavelength range from 390 nm to 480 nm is used. Therefore, the design of the present invention is easier to achieve uniform display of a single color.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
 a substrate;
 a patterned wall disposed on the substrate and having a plurality of openings;
 a first sub-pixel disposed in one of the openings and comprising a first light-emitting element and a first wavelength conversion layer, wherein the first light-emitting element is disposed on the substrate, and the first wavelength conversion layer covers the first light-emitting element;
 a second sub-pixel disposed in one of the openings and comprising a second light-emitting element and a second wavelength conversion layer, wherein the second light-emitting element is disposed on the substrate, and the second wavelength conversion layer covers the second light-emitting element;
 a third sub-pixel disposed in one of the openings and comprising a third light-emitting element and a third wavelength conversion layer, wherein the third light-emitting element is disposed on the substrate, the third wavelength conversion layer covers the third light-emitting element, and a first distance between a first top surface of the first light-emitting element and a second top surface of the patterned wall is about 10 um to about 100 um; and
 a first optical layer disposed on the patterned wall and in direct contact with at least one of the first sub-pixel, the second sub-pixel, and the third sub-pixel, wherein the first optical layer is a distributed bragg reflector;
 wherein the patterned wall is on sides of the first, second, and third light-emitting elements.

2. The display device of claim 1, wherein the first top surface of the first light-emitting element substantially levels with a third top surface of the second light-emitting element, and the first top surface of the first light-emitting element substantially levels with a fourth top surface of the third light-emitting element.

3. The display device of claim 1, wherein the first, second and third light-emitting elements respectively emit a light with a first wavelength.

4. The display device of claim 3, wherein the first wavelength conversion layer allows the light with the first wavelength to penetrate, the second wavelength conversion layer converts the light with the first wavelength into a light with a second wavelength, and the third wavelength conversion layer converts the light with the first wavelength into a light with a third wavelength.

5. The display device of claim 4, wherein the first optical layer covers the second sub-pixel and the third sub-pixel, and the first optical layer mainly reflects the lights with the first wavelength emitted from the second and third light-emitting elements.

6. The display device of claim 4, wherein the first optical layer fully covers the first sub-pixel, the second sub-pixel and the third sub-pixel, wherein the first optical layer comprises a first portion and a second portion, the first portion is disposed on the first sub-pixel, and the second portion is disposed on the second and third sub-pixels.

7. The display device of claim 1, further comprising a second optical layer disposed between the patterned wall and the first optical layer.

8. The display device of claim 1, wherein the patterned wall comprises at least one of a light-absorbing material and a light-reflecting material.

9. The display device of claim 1, further comprising a planarization layer disposed between the substrate and the patterned wall, wherein the first, second, and third light-emitting elements are embedded in the planarization layer.

10. The display device of claim 1, further comprising a planarization layer disposed between the substrate and the patterned wall, wherein an upper surface of the planarization layer is higher than top surfaces of the first, second, and third light-emitting elements.

11. The display device of claim 1, further comprising a planarization layer disposed between the substrate and the patterned wall, and an upper surface of the planarization layer substantially levels with top surfaces of the first, second, and third light-emitting elements.

12. The display device of claim 1, further comprising a fourth sub-pixel disposed in one of the openings and comprising a fourth light-emitting element and a fourth wavelength conversion layer, wherein the fourth light-emitting element is disposed on the substrate, and the fourth wavelength conversion layer covers the fourth light-emitting element.

13. The display device of claim 12, wherein the first, second, third, and fourth light-emitting elements are red light-emitting elements, blue light-emitting elements, green light-emitting elements, white light-emitting elements, or a combination thereof.

14. A display device, comprising:
- a substrate;
- a patterned wall disposed on the substrate and having an opening;
- a first light-emitting element, a second light-emitting element, and a third light-emitting element disposed in the opening and on the substrate, wherein the patterned wall is on sides of the first, second, and third light-emitting elements;
- a wavelength conversion layer disposed in the opening and covering the first, second, and third light-emitting elements, wherein a first distance between a first top surface of the first light-emitting element and a second top surface of the patterned wall is about 10 um to about 100 um; and
- an optical layer disposed on the patterned wall, wherein the optical layer is a distributed bragg reflector.

15. The display device of claim 14, wherein the first top surface of the first light-emitting element substantially levels with a third top surface of the second light-emitting element, and the first top surface of the first light-emitting element substantially levels with a fourth top surface of the third light-emitting element.

16. The display device of claim 14, wherein the first light-emitting element emit a light with a first wavelength, the second light-emitting element emit a light with a second wavelength, the third light-emitting element emit a light with a third wavelength, and the wavelength conversion layer converts the light with the third wavelength into a light with a fourth wavelength or converts the light with the second wavelength into a light with a fifth wavelength.

17. The display device of claim 14, further comprising a planarization layer disposed between the substrate and the patterned wall, wherein the planarization layer covers the first, second, and third light-emitting elements.

18. The display device of claim 14, further comprising a planarization layer disposed between the substrate and the patterned wall, wherein an upper surface of the planarization layer is higher than top surfaces of the first, second, and third light-emitting elements.

19. The display device of claim 14, further comprising a planarization layer disposed between the substrate and the patterned wall, wherein an upper surface of the planarization layer substantially levels with top surfaces of the first, second, and third light-emitting elements.

20. The display device of claim 14, wherein the patterned wall comprises at least one of a light-absorbing material and a light-reflecting material.

21. The display device of claim 14, wherein the optical layer comprises a monolayer or a multilayer.

22. The display device of claim 14, wherein the optical layer is in direct contact with the wavelength conversion layer.

* * * * *